United States Patent
Uchida

(10) Patent No.: US 9,595,809 B2
(45) Date of Patent: Mar. 14, 2017

(54) WAVELENGTH TUNABLE LASER DEVICE AND OPTICAL COHERENCE TOMOGRAPHY APPARATUS

(71) Applicant: CANON KABUSHIKI KAISHA, Tokyo (JP)

(72) Inventor: Takeshi Uchida, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/002,390

(22) Filed: Jan. 20, 2016

(65) Prior Publication Data

US 2016/0233644 A1    Aug. 11, 2016

(30) Foreign Application Priority Data

Feb. 5, 2015 (JP) .................................. 2015-021296
Jan. 14, 2016 (JP) .................................. 2016-005106

(51) Int. Cl.
| | | |
|---|---|---|
| H01S 3/10 | (2006.01) | |
| H01S 5/10 | (2006.01) | |
| H01S 5/34 | (2006.01) | |
| H01S 5/125 | (2006.01) | |
| H01S 5/183 | (2006.01) | |
| G01B 9/02 | (2006.01) | |
| H01S 5/343 | (2006.01) | |

(52) U.S. Cl.
CPC ............ *H01S 5/1096* (2013.01); *H01S 5/105* (2013.01); *H01S 5/1039* (2013.01); *H01S 5/125* (2013.01); *H01S 5/18302* (2013.01); *H01S 5/18361* (2013.01); *H01S 5/34* (2013.01); *G01B 9/02004* (2013.01); *G01B 9/02091* (2013.01); *H01S 5/18341* (2013.01); *H01S 5/18366* (2013.01); *H01S 5/34313* (2013.01); *H01S 5/34373* (2013.01)

(58) Field of Classification Search
CPC ... H01S 5/125; H01S 3/10; H01L 21/823431; G01B 9/02091
USPC .......................................................... 372/20
See application file for complete search history.

(56) References Cited

U.S. PATENT DOCUMENTS

| | | |
|---|---|---|
| 9,124,070 B2 | 9/2015 | Uchida |
| 2003/0010984 A1* | 1/2003 | Bosco ................. H01L 21/8258 257/79 |
| 2013/0056621 A1 | 3/2013 | Suga et al. |

OTHER PUBLICATIONS

Donnie J. Chang-Hasnaim, Fellow, IEEE, "Tunable VCSEL", IEEE Journal on Selected Topics in Quantum Electronics, vol. 6, No. 6, pp. 978-987 (2000).

* cited by examiner

*Primary Examiner* — Tuan Nguyen
(74) *Attorney, Agent, or Firm* — Fitzpatrick, Cella, Harper & Scinto

(57) ABSTRACT

A wavelength tunable laser device, including: a first reflector; a second reflector; an active layer formed between the first reflector and the second reflector; a quantum well structure layer that exhibits a quantum confined stark effect; and an electrode configured to apply a reverse bias voltage to the quantum well structure layer, wherein the active layer and the second reflector have a gap formed therebetween, the gap having a length to be changed to thereby sweep a resonance wavelength, and wherein the electrode is further configured to change application of the reverse bias voltage to be applied to the quantum well structure layer depending on the length of the gap when the resonance wavelength is swept.

13 Claims, 8 Drawing Sheets

WAVELENGTH TUNABLE LASER DEVICE AND OPTICAL COHERENCE TOMOGRAPHY APPARATUS

BACKGROUND OF THE INVENTION

Field of the Invention

The present invention relates to a wavelength tunable laser device and an optical coherence tomography apparatus using the wavelength tunable laser device.

Description of the Related Art

In recent times, a wavelength tunable laser device that can change a wavelength of laser light emitted therefrom is attracting attention. As the wavelength tunable laser device, a vertical cavity surface emitting laser (VCSEL) device is proposed (Connie J. Chang-Hasnain, Fellow, IEEE, "Tunable VCSEL", IEEE Journal on Selected Topics in Quantum Electronics, Vol. 6, No. 6, pp. 978-987, 2000.). In the vertical cavity surface emitting laser device, through displacement of one of two reflectors, an interval between the two reflectors is changed, thereby changing an oscillation wavelength, that is, a resonance wavelength, of laser light. As a movable portion (movable mechanism) configured to displace a reflector, one to which a micro electro mechanical systems (MEMS) technology is applied has been proposed. A vertical cavity surface emitting laser device to which the MEMS technology is applied is referred to as a MEMS-VCSEL.

The MEMS-VCSEL can continuously change the wavelength. Further, in the MEMS-VCSEL, the movable portion is minute. Therefore, the movable portion can be displaced at high speed, and thus, the wavelength can be changed at high speed. Further, the MEMS-VCSEL has low power consumption. Such characteristics of the MEMS-VCSEL attract great attention thereto.

SUMMARY OF THE INVENTION

According to one aspect of an embodiment, there is provided a wavelength tunable laser device, including: a first reflector; a second reflector; an active layer formed between the first reflector and the second reflector; a quantum well structure layer that exhibits a quantum confined stark effect by a reverse bias voltage; and an electrode configured to apply the reverse bias voltage to the quantum well structure layer, wherein the active layer and the second reflector have a gap formed therebetween, the gap having a length to be changed to thereby sweep a resonance wavelength, and wherein the electrode is further configured to change application of the reverse bias voltage to be applied to the quantum well structure layer depending on the length of the gap when the resonance wavelength is swept.

According to another aspect of an embodiment, there is provided an optical coherence tomography apparatus, including: a wavelength tunable laser device including: a first reflector; a second reflector; an active layer formed between the first reflector and the second reflector; a quantum well structure layer that exhibits a quantum confined stark effect by a reverse bias voltage; and an electrode configured to apply the reverse bias voltage to the quantum well structure layer, wherein the active layer and the second reflector have a gap formed therebetween, the gap having a length to be changed to thereby sweep a resonance wavelength, and wherein the electrode is further configured to change application of the reverse bias voltage to be applied to the quantum well structure layer so that a gain of a laser at the resonance wavelength becomes larger than a gain of the laser at a wavelength in another mode capable of causing an oscillation when the resonance wavelength is swept, the optical coherence tomography apparatus further including: an interference optical system configured to cause light from the wavelength tunable laser device to branch off into irradiation light to be radiated to an object to be measured and reference light, and to generate coherent light with reflection light of the irradiation light radiated to the object to be measured and the reference light; a light detection unit configured to receive the coherent light; and an information acquisition unit configured to acquire information on the object to be measured based on a signal received from the light detection unit.

Further features of the present invention will become apparent from the following description of exemplary embodiments with reference to the attached drawings.

DESCRIPTION OF THE EMBODIMENTS

Figure 1A:
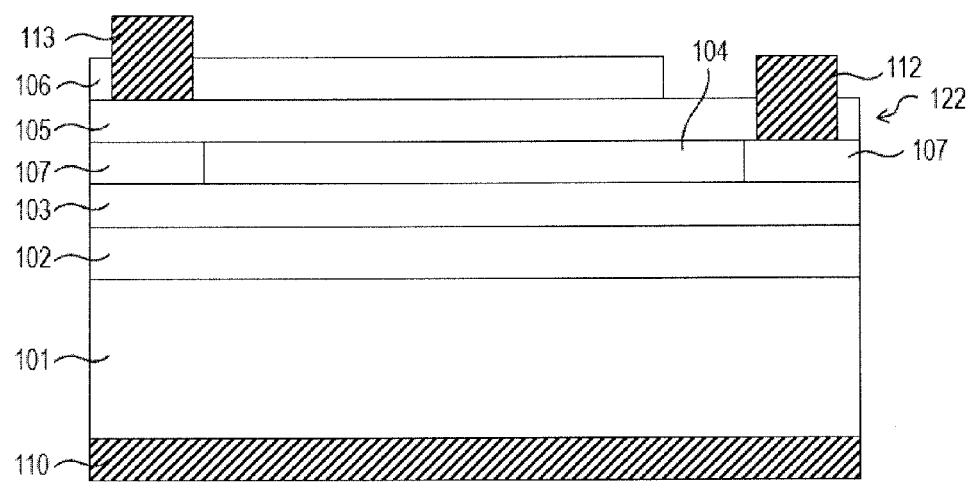
FIG. 1A and FIG. 1B are a sectional view and a plan view, respectively, for illustrating a wavelength tunable laser device according to a first embodiment of the present invention.

In the related-art vertical cavity surface emitting laser device, a sufficiently wide wavelength tunable width cannot necessarily be acquired. In the related-art vertical cavity surface emitting laser device, a sufficiently wide wavelength tunable width cannot necessarily be acquired for the following reasons.

In the vertical cavity surface emitting laser device, by applying a voltage to, for example, a beam-like support portion configured to support an upper reflector, the beam-like support portion is displaced. When the voltage is applied to the beam-like support portion, an electrostatic attractive force is generated to displace the beam-like support portion in a direction of reducing a length of a gap existing between the upper reflector and a lower reflector. The beam-like support portion is held under a state in which resilience of a spring on the beam-like support portion and the electrostatic attractive force are balanced with each other. When the voltage applied to the beam-like support portion exceeds a certain value, the resilience of the spring on the beam-like support portion and the electrostatic attractive force are not balanced with each other anymore, and the beam-like support portion is brought into contact with a member existing below the beam-like support portion. In general, when the beam-like support portion is displaced by about ⅓ of an initial gap length, the resilience of the spring on the beam-like support portion and the electrostatic attractive force are not balanced with each other anymore, and the beam-like support portion is brought into contact with a member existing below the beam-like support portion. In this way, a displacement of the beam-like support portion is limited to about ⅓ of the initial gap length. Such a limitation is referred to as a "⅓ rule". An amount of displacement of the beam-like support portion is limited to about ⅓ of the initial gap length, and thus, from the viewpoint of the ⅓ rule, it is preferred that the initial gap length be large.

On the other hand, when the interval between the lower reflector and the upper reflector is simply changed, transition from one mode to another mode, that is, mode hopping occurs. The mode hopping occurs due to existence of a plurality of longitudinal modes in a wavelength range in which laser oscillations are allowed. If a longitudinal mode spacing is wider than the wavelength range in which laser oscillations are allowed, the mode hopping does not occur. Specifically, if another longitudinal mode does not exist in the wavelength range in which laser oscillations are allowed, there is no mode to be hopped to, and thus, the mode hopping does not occur. If another longitudinal mode does not exist in the wavelength range in which laser oscillations are allowed, an oscillation wavelength, that is, a resonance wavelength, can be changed over the entire wavelength range in which laser oscillations are allowed. To reduce the interval between the lower reflector and the upper reflector is a method of increasing the longitudinal mode spacing. Reduction of the interval between the lower reflector and the upper reflector results in reduction of the gap length. Therefore, from the viewpoint of inhibiting the mode hopping, it is preferred that the gap length be small.

As described above, in the vertical cavity surface emitting laser device, from the viewpoint of the ⅓ rule, it is preferred that the initial gap length be large, and, from the viewpoint of inhibiting the mode hopping, it is preferred that the initial gap length be small. In other words, the vertical cavity surface emitting laser device has a trade-off relationship with respect to the initial gap length.

Figure 9:
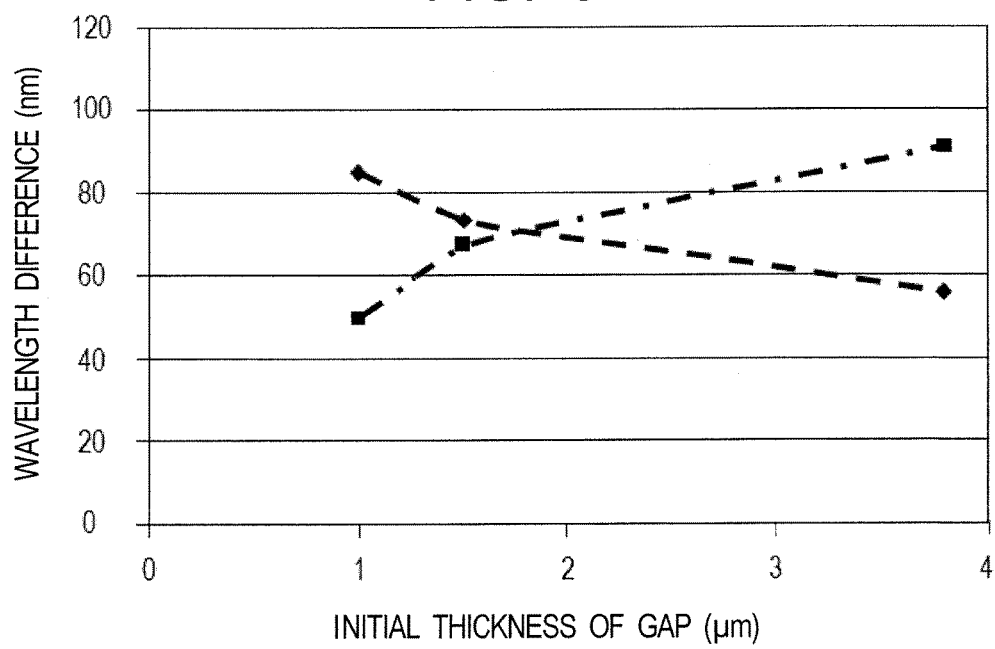
FIG. 9 is a graph for showing a result of a simulation in a vertical cavity surface emitting laser device according to a reference example.

FIG. 9 is a graph for showing a result of a simulation in a vertical cavity surface emitting laser device according to a reference example. Plots on the dot-and-dash line represent an amount of change in oscillation wavelength when a beam-like support portion is displaced by ⅓ of an initial gap length. Specifically, the plots on the dot-and-dash line represent a difference between an oscillation wavelength before the displacement and an oscillation wavelength after the displacement, that is, a wavelength difference in oscillation wavelength between before and after the displacement. Plots on the broken line represent a longitudinal mode spacing corresponding to the initial gap length, that is, a wavelength difference between modes corresponding to the initial gap length.

As can be seen from FIG. 9, as the initial gap length becomes larger, the wavelength difference when the beam-like support portion is displaced by ⅓ of the initial gap length becomes larger. On the other hand, as the initial gap length becomes larger, the longitudinal mode spacing corresponding to the initial gap length becomes smaller.

As can be seen from FIG. 9, the largest wavelength difference is acquired when the initial gap length is about 1.7 µm. When the initial gap length is set to be about 1.7 µm, a wavelength difference of about 70 nm, that is, a wavelength tunable width of about 70 nm can be acquired.

For the reasons described above, in the related-art wavelength tunable laser device, a sufficiently wide wavelength tunable width cannot necessarily be acquired.

As a result of diligent review, the inventor of the subject application has conceived to improve the wavelength tunable width by the following way.

Now, embodiments for carrying out the present invention are described in detail with reference to the drawings.

First Embodiment

A wavelength tunable laser device according to a first embodiment of the present invention and a measuring device using the wavelength tunable laser device are described with reference to FIG. 1A to FIG. 4.

(Wavelength Tunable Laser Device)

First, a wavelength tunable laser device 10 according to this embodiment is described.

The wavelength tunable laser device 10 according to this embodiment is a wavelength tunable laser device to which a MEMS technology is applied, and more specifically, a vertical cavity surface emitting laser device to which the MEMS technology is applied (MEMS-VCSEL).

FIG. 1A is a sectional view for illustrating the wavelength tunable laser device according to this embodiment.

As illustrated in FIG. 1A, a reflector (first reflector, lower reflector) 102 is formed on a substrate 101. As the substrate 101, for example, an n-type GaAs substrate is used. As the lower reflector 102, for example, a distributed Bragg reflector (DBR) is formed. The lower reflector 102 is formed of, for example, alternately laminated layers including 30 pairs of a GaAs layer and an AlAs layer each having an optical thickness of ¼ of $\lambda c1$. Here, $\lambda c1$ is a center wavelength of a highly reflective band of the lower reflector 102, and is, for example, about 1,057 nm in this embodiment. Note that, the term "highly reflective band of reflector" as used herein means a wavelength band in which the reflector can acquire a sufficient reflectivity for allowing laser oscillations, and specifically means a wavelength band in which the reflector can acquire a reflectivity of 98% or larger. Note that, an electrode (n-side electrode, rear surface electrode) 110 is formed on a rear surface (lower surface) of the substrate 101.

An active layer 103 is formed on the lower reflector 102, that is, on a first reflector. The active layer 103 has a quantum well (not shown) obtained by sandwiching an $In_{0.35}GaAs$ layer (not shown) having a thickness of about 8 nm between GaAsP layers (not shown). The active layer 103 further has a quantum well (not shown) obtained by sandwiching an $In_{0.32}GaAs$ layer (not shown) having a thickness of about 8 nm between GaAsP layers (not shown). Phosphorus (P) has an action of reducing a lattice constant of GaAs. On the other hand, indium (In) has an action of increasing the lattice constant of GaAs. Therefore, cumulative distortion is suppressed in the active layer 103 including the InGaAs layers and the GaAsP layers. A conductive type of the active layer 103 is set to, for example, i-type (undoped). The active layer 103 is formed so that a wavelength exhibited when a threshold current has a minimum value falls on a wavelength side shorter than center wavelengths λc1 and λc2 (hereinafter also referred to collectively as "center wavelength λc1, λc2") of highly reflective bands of the reflector 102 and an upper reflector 106 (hereinafter also referred to collectively as "reflector 102, 106"). A gain of the active layer 103 at a wavelength shorter than the center wavelength λc1, λc2 is larger than a gain of the active layer 103 at a wavelength longer than the center wavelength λc1, λc2. Note that, the threshold current referred to herein represents a minimum current capable of causing laser oscillation.

Two support portions 107 are formed on the active layer 103 so as to be spaced apart from each other. A quantum well structure layer (multiple quantum well structure layer, QCSE layer) 105 that exhibits a quantum confined stark effect (QCSE) is formed above the active layer 103. The quantum confined stark effect is a phenomenon that an absorption edge wavelength shifts toward a long wavelength side when an electric field is applied to a quantum well structure. A beam-like support portion 122 is formed by the quantum well structure layer 105. That is, the quantum well structure layer 105 serves as the beam-like support portion 122. The beam-like support portion 122 is formed through use of the MEMS technology. Both ends of the beam-like support portion 122 are fixed by the support portions 107. The beam-like support portion 122 displaceably supports the upper reflector 106. A mechanism (movable mechanism, support mechanism) configured to change an interval between the lower reflector 102 and the upper reflector 106 is formed by the beam-like support portion 122 described above. In other words, a mechanism configured to change a gap between the lower reflector 102 and the upper reflector 106 is formed by the beam-like support portion 122. Note that, it is conceivable that a movable mechanism (movable portion) 122 is formed by a combination of the quantum well structure layer 105 and the upper reflector 106. The support portion 107 is set to have a thickness of, for example, about 3.8 µm. Therefore, a length of a gap (air gap) 104 exhibited under a state in which no voltage is applied to the beam-like support portion 122, that is, in an initial state is, for example, about 3.8 µm. That is, in this embodiment, the length of the gap 104 exhibited under the state in which no voltage is applied to the beam-like support portion 122, that is, under a state in which the interval between the lower reflector 102 and the upper reflector 106 is not changed is larger than 1.7 µm. That is, the length of the gap 104 exhibited when no voltage is applied to the beam-like support portion 122 is longer than 1.7 µm.

The quantum well structure layer 105 has a quantum well (not shown) obtained by sandwiching, for example, an $In_{0.32}GaAs$ layer (not shown) having a thickness of about 6 nm between GaAs layers (not shown). It is preferred that the quantum well structure layer 105 have a multiple quantum well structure obtained by multiplexing quantum well structures. On a lower surface side of the quantum well structure layer 105, for example, an n-type semiconductor layer (not shown) is formed. As the n-type semiconductor layer, for example, an n-type doped $Al_{0.2}GaAs$ layer is formed. On the other hand, on an upper surface side of the quantum well structure layer 105, for example, a p-type semiconductor layer (not shown) is formed. As the p-type semiconductor layer, for example, a p-type doped $Al_{0.2}GaAs$ layer is formed. In this manner, the quantum well structure layer 105 has a p-i-n structure in which the p-type semiconductor layer and the n-type semiconductor layer are formed above and below an i-type (non-doped) quantum well structure. Application of a voltage to the quantum well structure layer 105 means application of a voltage to the p-i-n structure of the quantum well structure layer 105, or more specifically, application of a reverse bias (reverse voltage) between the p-type semiconductor layer and the n-type semiconductor layer of the quantum well structure layer 105. When a negative voltage is applied to a side of the p-type semiconductor layer and a positive voltage is applied to a side of the n-type semiconductor layer, the reverse voltage is applied to the quantum well structure layer 105.

Under the state in which no voltage is applied to the quantum well structure layer 105, a band gap of the quantum well structure layer 105 is set so that an absorption edge wavelength of the quantum well structure layer 105 does not fall within the highly reflective band of the reflector 102, 106. Under the state in which no reverse bias voltage is applied to the quantum well structure layer 105, an absorption edge of the quantum well structure layer 105 falls on a wavelength side shorter than a shortest wavelength within a sweep range of a resonance wavelength. Under the state in which no voltage is applied to the quantum well structure layer 105, that is, under the state in which no reverse bias is applied thereto, the quantum well structure layer 105 does not exert particular influence on an oscillation within the highly reflective band of the reflector 102, 106.

On the other hand, under a state in which a voltage is applied to the quantum well structure layer 105, the band gap of the quantum well structure layer 105 is set so that the absorption edge wavelength of the quantum well structure layer 105 falls within the highly reflective band of the reflector 102, 106. Specifically, the quantum well structure layer 105 is configured such that absorption occurs on a wavelength side shorter than the center wavelength λc1, λc2 of the highly reflective band of the reflector 102, 106 when a voltage is applied to the quantum well structure layer 105. Therefore, under the state in which a voltage is applied to the quantum well structure layer 105, the oscillation is inhibited on the wavelength side shorter than the center wavelength λc1, λc2 of the highly reflective band of the reflector 102, 106. That is, a reverse bias voltage is applied to the quantum well structure layer 105 to generate an oscillation at a wavelength longer than a predetermined wavelength.

Figure 2:
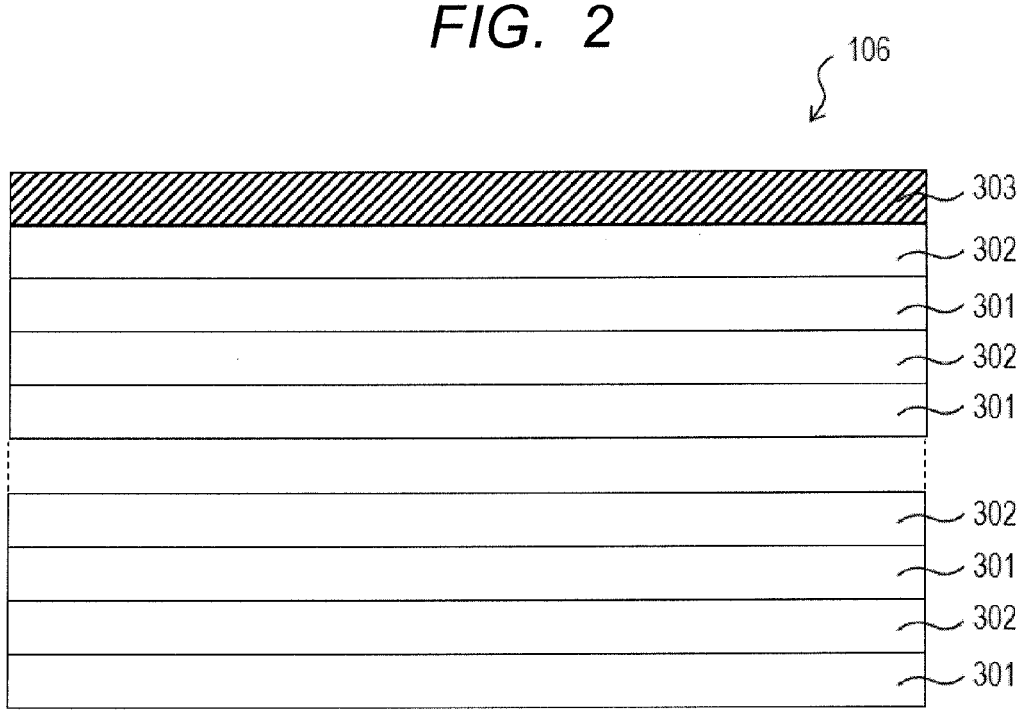
FIG. 2 is a sectional view of an upper reflector of the wavelength tunable laser device according to the first embodiment of the present invention.

The reflector (second reflector, upper reflector) 106 is formed on the quantum well structure layer 105, that is, on the beam-like support portion 122. The upper reflector 106 is displaceably supported by the beam-like support portion 122. As the upper reflector 106, for example, a DBR is formed. FIG. 2 is a sectional view of the upper reflector of the wavelength tunable laser device according to this embodiment. As illustrated in FIG. 2, the upper reflector 106 includes an alternately laminated film including, for example, 15 pairs of a $SiO_2$ layer 301 and a $TiO_2$ layer 302 each having an optical film thickness of ¼ of λc2. The center wavelength λc2 of the highly reflective band of the upper reflector 106 is set to, for example, about 1,057 nm in this embodiment.

An intermediate refractive index layer 303 having an intermediate refractive index between $SiO_2$ and $TiO_2$ is formed on the $TiO_2$ layer 302 located at the top of the alternately laminated film formed of the pairs of the $SiO_2$ layers 301 and the $TiO_2$ layers 302. As the intermediate refractive index layer 303, for example, a SiN layer is used. The optical film thickness of the intermediate refractive index layer 303 is set larger than ¼ of the center wavelength λc2 of the highly reflective band of the upper reflector 106. More specifically, the optical film thickness of the intermediate refractive index layer 303 is set to, for example, 1.05 times as large as ¼ of the center wavelength λc2 of the highly reflective band of the upper reflector 106.

The intermediate refractive index layer 303 described above is formed in the upper reflector 106, and hence a point at which a reflectance of the upper reflector 106 becomes minimum, namely, a dip is observed in a wavelength corresponding to a thickness of the intermediate refractive index layer 303. In this embodiment, the optical film thickness of the intermediate refractive index layer 303 is larger than ¼ of the center wavelength λc2 of the highly reflective band of the upper reflector 106, and hence a dip is observed on a wavelength side longer than the center wavelength λc2 of the highly reflective band of the upper reflector 106. The dip is observed on the wavelength side longer than the center wavelength λc2 of the highly reflective band of the upper reflector 106, and hence a threshold gain is relatively large on the wavelength side longer than the center wavelength λc2 of the highly reflective band of the upper reflector 106. Therefore, the threshold gain is relatively small on a wavelength side shorter than the center wavelength λc2 of the highly reflective band of the upper reflector 106. Note that, the threshold gain represents a gain obtained when the gain exceeds a loss to cause the laser oscillation. In this manner, in this embodiment, the upper reflector 106 is configured such that the threshold gain on the short wavelength side becomes relatively small and that the threshold gain on the high wavelength side becomes relatively large. Therefore, under the state in which no voltage is applied to the quantum well structure layer 105, the oscillation is easily caused on the wavelength side shorter than the center wavelength λc2 of the highly reflective band of the upper reflector 106.

Figure 1B:
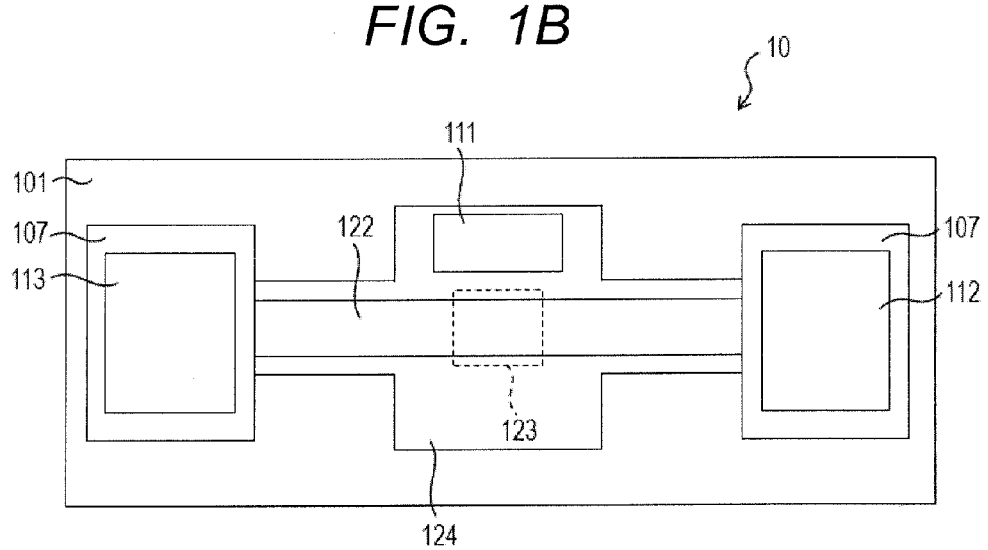

FIG. 1B is a plan view of the wavelength tunable laser device according to this embodiment. In FIG. 1B, the wavelength tunable laser device 10 according to this embodiment is viewed from the upper surface side.

As illustrated in FIG. 1B, the two support portions 107 are formed above the substrate 101 so as to be spaced apart from each other. Both the ends of the beam-like support portion 122 formed through the use of the MEMS technology are fixed by the support portions 107. In FIG. 1B, a region 123 indicated by the broken line conceptually represents a region that emits light. The region 123 that emits light is a part of a laser portion 124.

An electrode 111 is an electrode configured to inject a current into the active layer 103, and is in contact with an upper surface of the active layer 103. The electrode 113 is an electrode configured to apply a voltage to the quantum well structure layer 105, and is connected to the p-type semiconductor layer located on an upper surface of the quantum well structure layer 105. The electrode 112 is an electrode configured to apply a voltage to the quantum well structure layer 105, and is connected to the n-type semiconductor layer located on a lower surface of the quantum well structure layer 105. When a reverse bias is applied to the quantum well structure layer 105, a potential of the electrode 112 connected to the n-type semiconductor layer located on the lower surface of the quantum well structure layer 105 is set higher than a potential of the electrode 113 connected to the p-type semiconductor layer located on the upper surface of the quantum well structure layer 105. In this embodiment, the quantum well structure layer 105 can be controlled by changing a voltage to be applied between a pair of electrodes 112 and 113, namely, one electrode 112 and another electrode 113.

Further, in this embodiment, through changing of the voltage to be applied between the electrode 110 and the electrode 112, the beam-like support portion 122 can be displaced, and an oscillation wavelength, namely, a resonance wavelength can be swept.

A resonator 12 of the wavelength tunable laser device 10 according to this embodiment includes the lower reflector 102, the active layer 103, the quantum well structure layer 105, the upper reflector 106, and the mechanism (movable mechanism) 122 configured to change the interval between the lower reflector 102 and the upper reflector 106. The gap 104 having a length that changes along with a change in interval between the lower reflector 102 and the upper reflector 106 exists between the lower reflector 102 and the upper reflector 106.

In this way, the wavelength tunable laser device 10 according to this embodiment is formed.

Figure 3:
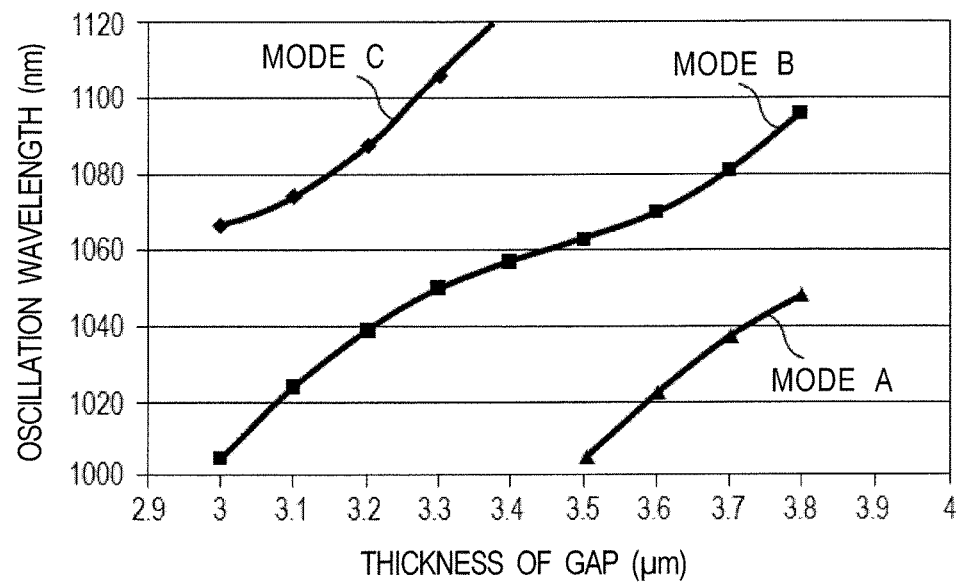
FIG. 3 is a graph for showing a relationship among a gap length, an oscillation wavelength, and modes.

FIG. 3 is a graph for showing a relationship among the gap length, the oscillation wavelength, and modes. The horizontal axis denotes the length of the gap 104. The vertical axis denotes the oscillation wavelength of laser light.

As can be seen from FIG. 3, under the state in which no voltage is applied to the beam-like support portion 122, the length of the gap 104 is, for example, about 3.8 μm. When the length of the gap 104 is about 3.8 μm, there exists a mode in which resonance occurs at a wavelength of, for example, about 1,098 nm. This resonance mode (longitudinal mode) is herein referred to as Mode B. As can be seen from FIG. 3, when the length of the gap 104 is about 3.8 μm, there exists another mode in which resonance occurs at a wavelength shorter than 1,098 nm. This resonance mode is herein referred to as Mode A.

When the interval between the reflector 102 and the reflector 106 is reduced so that the length of the gap 104 is, for example, about 3.0 μm, the oscillation wavelength in Mode B is, for example, about 1,007 nm. As can be seen from FIG. 3, when the length of the gap 104 is about 3.0 μm, there exists still another mode in which resonance occurs at a wavelength longer than 1,007 nm. This resonance mode is herein referred to as Mode C.

According to this embodiment, a plurality of modes, that is, two or more modes, exist in the highly reflective band of the reflector 102, 106, that is, in a range in which the oscillation wavelength of laser light can be changed. More specifically, in this embodiment, the three modes exist in the range in which the oscillation wavelength of laser light can be changed. Therefore, when the interval between the lower reflector 102 and the upper reflector 106 is simply changed, transition from Mode B to other modes: Mode A and Mode C, that is, mode hopping may occur.

Therefore, according to this embodiment, by appropriately controlling a voltage to be applied to the quantum well structure layer 105 depending on the length of the gap between the lower reflector 102 and the upper reflector 106, mode hopping is prevented and oscillation in Mode B is maintained in a wide wavelength band.

When resonance is produced at a wavelength longer than 1,057 nm being the center wavelength λc1, λc2 of the highly reflective band of the reflector 102, 106, a current is injected into the active layer 103 while a voltage (reverse bias) is applied to the quantum well structure layer 105. Specifically, the potential of the electrode 112 and the potential of the electrode 113 are set so that the potential of the electrode 112 becomes higher than the potential of the electrode 113 by, for example, about 10 V. When a reverse bias is applied to the quantum well structure layer 105, the absorption edge wavelength of the quantum well structure layer 105 shifts toward the long wavelength side, which inhibits the oscillation on the wavelength side shorter than the center wavelength λc1, λc2 of the highly reflective band of the reflector 106. Accordingly, the oscillation positively caused at a relatively long wavelength is realized when a reverse bias is applied to the quantum well structure layer 105.

On the other hand, when resonance is produced at a wavelength shorter than 1,057 nm being the center wavelength λc1, λc2 of the highly reflective band of the reflector 102, 106, a current is injected into the active layer 103 but no voltage is applied to the quantum well structure layer 105. Specifically, a potential difference between the electrode 112 and the electrode 113 is set to 0 V. When no voltage is applied to the quantum well structure layer 105, the absorption edge wavelength of the quantum well structure layer 105 becomes a wavelength shorter than that of the highly reflective band of the reflector 102, 106. As described above, in this embodiment, the upper reflector 106 is configured such that the threshold gain on the short wavelength side becomes relatively small and that the threshold gain on the high wavelength side becomes relatively large. Therefore, under the state in which no voltage is applied to the quantum well structure layer 105, the oscillation is easily caused on the wavelength side shorter than the center wavelength λc2 of the highly reflective band of the upper reflector 106. Therefore, the oscillation positively caused within a relatively short wavelength range is realized under the state in which no voltage is applied to the quantum well structure layer 105.

The length of the gap 104 corresponding to 1,057 nm being the center wavelength λc1, λc2 of the highly reflective band of the reflector 102, 106 is, for example, about 3.4 µm. Accordingly, when the length of the gap 104 is equal to or longer than, for example, 3.4 µm, a voltage is applied to the quantum well structure layer 105 in order to realize the oscillation positively caused at a relatively long wavelength. On the other hand, when the length of the gap 104 is shorter than, for example, 3.4 µm, no voltage is applied to the quantum well structure layer 105 in order to realize the oscillation positively caused at a relatively short wavelength.

The length of the gap 104 can be changed by changing a voltage applied to the beam-like support portion 122. In other words, the length of the gap 104 can be changed by changing a voltage applied between the electrode 110 and the electrode 112. Note that, the length of the gap 104 is changed by changing the voltage applied to the beam-like support portion 122 because, by changing the voltage applied to the beam-like support portion 122, an electrostatic attractive force that acts on the beam-like support portion 122 is changed. That is, the length of the gap is changed when an alternating voltage is applied to the beam-like support portion 122 to cause the upper reflector 106 to vibrate. Further, application of a reverse bias voltage to be applied to the quantum well structure layer 105 can be changed so as to correspond to an amplitude change in the alternating voltage applied to the support portion 122.

The voltage applied to the electrode 112, which sets the length of the gap 104 to be, for example, 3.4 µm, can be determined in advance. Accordingly, when the voltage applied to the electrode 112 is such a voltage as to set the length of the gap 104 to be equal to or longer than 3.4 µm, a voltage is applied to the quantum well structure layer 105. That is, when the voltage applied to the electrode 112 is equal to or lower than a predetermined voltage, a voltage between the electrode 112 and the electrode 113 is set to, for example, about 10 V. On the other hand, when such a voltage as to set the length of the gap 104 to be shorter than 3.4 µm is applied to the electrode 112, no voltage is applied to the quantum well structure layer 105. That is, when the voltage applied to the electrode 112 is higher than the predetermined voltage, the voltage between the electrode 112 and the electrode 113 is set to 0 V.

According to this embodiment, the oscillation wavelength of laser light is swept with, for example, the center wavelength λc1, λc2 of the highly reflective band of the reflector 102, 106 being a center of the sweep.

The application of a voltage to the quantum well structure layer 105 is thus controlled, and hence the voltage applied to the quantum well structure layer 105 when the length of the gap has a value equal to or larger than the predetermined value is higher than the voltage applied to the quantum well structure layer 105 when the length of the gap has a value smaller than the predetermined value.

In this manner, in this embodiment, when the oscillation is to be caused at a relatively long wavelength, a voltage is applied to the quantum well structure layer 105, to thereby realize the oscillation positively caused at a relatively long wavelength. On the other hand, when the oscillation is to be caused at a relatively short wavelength, no voltage is applied to the quantum well structure layer 105, to thereby realize the oscillation positively caused at a relatively short wavelength. Therefore, according to this embodiment, the mode hopping can be prevented with reliability, and a wavelength tunable laser device having a wide wavelength tunable width can be acquired.

(Result of Evaluation)

Next, a result of evaluation of the wavelength tunable laser device according to this embodiment is described.

Figure 10:
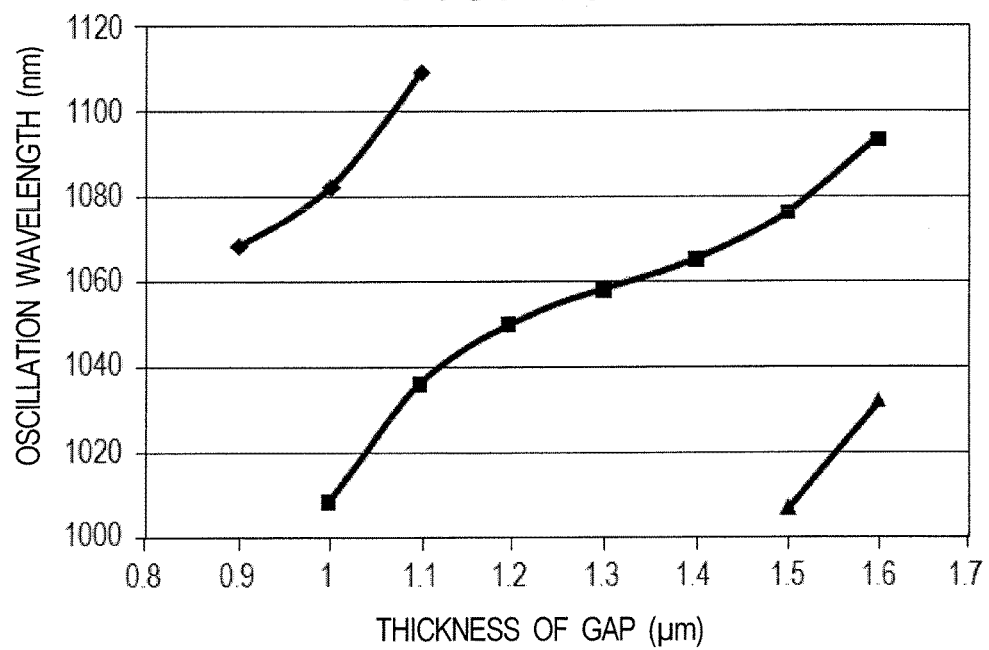
FIG. 10 is a graph for showing a relationship among a gap length, an oscillation wavelength, and modes in a wavelength tunable laser device according to a comparative example.

FIG. 10 is a graph for showing a relationship among the gap length, the oscillation wavelength, and the modes in a wavelength tunable laser device according to a comparative example. The comparative example changes the oscillation wavelength by simply changing the interval between the lower reflector and the upper reflector. That is, in the comparative example, the quantum well structure layer 105 is not provided unlike this embodiment.

In the comparative example, the initial gap length is about 1.5 µm. When the initial gap length is 1.5 µm, and the beam-like support portion is displaced by ⅓ of the initial gap length, the gap length becomes 1.0 µm.

As can be seen from FIG. 10, when the gap length is changed from 1.5 µm to 1.0 µm, the oscillation wavelength is changed by about 68 nm. When the gap length is smaller than 1.0 µm, the ⅓ rule is not satisfied, and the resilience of the spring on the beam-like support portion and the electrostatic attractive force may not be balanced with each other. Thus, it is not preferred that the gap length be smaller than 1.0 µm. Therefore, in the wavelength tunable laser device according to the comparative example, the wavelength tunable width is about 68 nm.

On the other hand, according to this embodiment, application of a voltage to the quantum well structure layer 105 is controlled depending on the length of the gap between the lower reflector 102 and the upper reflector 106, and thus, mode hopping can be prevented with reliability. Therefore, according to this embodiment, there is no restriction that is due to the longitudinal mode spacing as represented by the plots on the broken line in FIG. 9. Therefore, according to this embodiment, under the state in which no voltage is applied to the beam-like support portion 122, the length of the gap 104 can be considerably large. According to this embodiment, the initial length of the gap 104 can be considerably large, and thus, a length that is about ⅓ of the initial length of the gap 104 is sufficiently thick. Therefore, according to this embodiment, the oscillation wavelength can be changed in an extremely wide wavelength range.

When the length of the gap 104 is changed, for example, from 3.8 μm to 3.0 μm, as can be seen from FIG. 3, in a wavelength range of, for example, about 1,007 nm to about 1,098 nm, the oscillation wavelength can be changed without occurrence of mode hopping from Mode B to other modes: Mode A and Mode C. The wavelength difference between the wavelength of 1,098 nm and the wavelength of 1,007 nm is 91 nm. Specifically, according to this embodiment, a wavelength tunable width of, for example, about 91 nm can be acquired.

Figure 4:
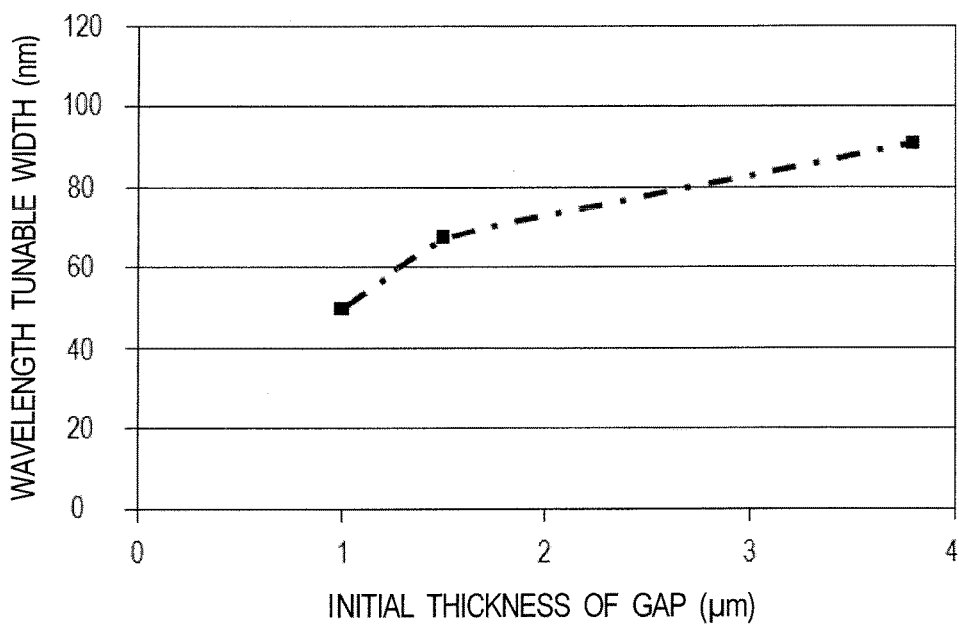
FIG. 4 is a graph for showing a relationship between an initial gap length and a wavelength tunable width in the wavelength tunable laser device according to the first embodiment of the present invention.

FIG. 4 is a graph for showing a relationship between the initial gap length and the wavelength tunable width in the wavelength tunable laser device according to this embodiment. The horizontal axis denotes the initial gap length and the vertical axis denotes the wavelength tunable width.

As can be seen from FIG. 4, when the initial length of the gap 104 is set to be 3.8 μm, the wavelength tunable width can be about 91 nm.

When the oscillation wavelength is changed from 1,098 nm to 1,007 nm, the length of the gap 104 is changed from 3.8 μm to 3.0 μm. The difference between the length of 3.8 μm and the length of 3.0 μm, that is, the amount of change in length of the gap 104, is about 0.8 μm. The amount of change in length of the gap 104 of 0.8 μm is sufficiently small with respect to ⅓ of the initial length of the gap 104. Therefore, even when the oscillation wavelength is changed from 1,098 nm to 1,007 nm, a sufficient margin to the ⅓ rule is secured.

As described above, according to this embodiment, a wavelength tunable laser device having an extremely wide wavelength tunable width can be acquired.

(Measuring Device)

Figure 5:
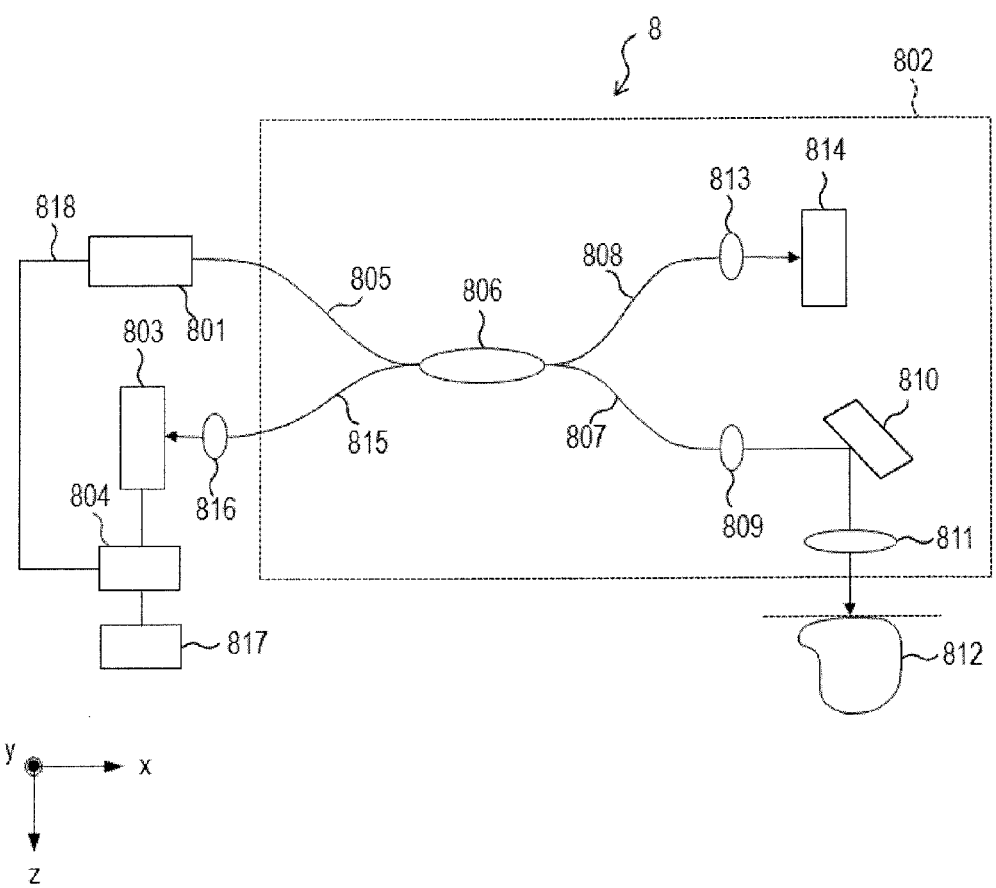
FIG. 5 is a schematic view for illustrating a measuring device according to the first embodiment of the present invention.

Next, a measuring device using the wavelength tunable laser device according to this embodiment is described with reference to FIG. 5. FIG. 5 is a schematic view for illustrating the measuring device according to this embodiment.

Note that, as an example, a case is herein described in which the wavelength tunable laser device 10 according to this embodiment is used for a light source unit 801 of an optical coherence tomography (OCT) apparatus, but the present invention is not limited thereto. The wavelength tunable laser device 10 according to this embodiment is not limited to the light source unit 801 of the optical coherence tomography apparatus, and can be used for various purposes. The optical coherence tomography apparatus in which the wavelength tunable laser device is used for the light source unit 801 eliminates the need for a spectroscope, and can thus acquire a tomographic image with low loss in light amount and a high S/N ratio.

As illustrated in FIG. 5, a measuring device (OCT device) 8 according to this embodiment includes the light source unit 801, an interference optical system 802, a light detection unit 803, and an information acquisition unit 804.

The wavelength tunable laser device 10 according to this embodiment is used for the light source unit 801.

The information acquisition unit 804 includes a Fourier transformer (not shown). The phrase "the information acquisition unit 804 includes a Fourier transformer" herein means that the information acquisition unit 804 has the function of performing a Fourier transform on data input thereto, and the mode of the Fourier transformer is not particularly limited. As an example, the information acquisition unit 804 includes an arithmetic portion (not shown) and the arithmetic portion has the function of performing a Fourier transform. More specifically, the arithmetic portion is a computer including a central processing unit (CPU), and the computer runs an application having the function of performing a Fourier transform. As another example, the information acquisition unit 804 includes a Fourier transform circuit having the function of performing a Fourier transform.

Light that is output from the light source unit 801 passes through the interference optical system 802 to be coherent light including information on an object 812 to be measured (measurement object), and the coherent light is received by the light detection unit 803.

Note that, the light detection unit 803 may be a photodetector of a differential detection type or may be a photodetector of a simple intensity monitor type.

Information on a time waveform of intensity of the coherent light received by the light detection unit 803 is output from the light detection unit 803 to the information acquisition unit 804.

The information acquisition unit 804 acquires information on the object 812 (for example, information on a tomographic image thereof) by acquiring a peak value of the time waveform of the intensity of the received coherent light and performing a Fourier transform.

In the following, from light emission from the light source unit 801 to acquisition of the information on the tomographic image of the object 812 to be measured is described in detail.

Light emitted from the light source unit 801 passes through a fiber 805, enters a coupler 806, and then, is branched into radiation light that passes through a fiber 807 for radiation light and reference light that passes through a fiber 808 for reference light. As the coupler 806, a 3 dB coupler that is a coupler having a branching ratio of 1:1 is used. The coupler 806 can operate in a single mode in a wavelength band of light emitted from the light source unit 801.

The radiation light propagating through the fiber 807 passes through a collimator 809 to be collimated light and is reflected by a mirror 810. Light reflected by the mirror 810 passes through a lens 811 to be radiated to the object 812, and is reflected by respective layers in a depth direction of the object 812.

On the other hand, the reference light propagating through the fiber 808 passes through a collimator 813 and is reflected by a mirror 814.

At the coupler 806, coherent light is generated with the reflection light from the object 812 and the reflection light from the mirror 814. The coherent light generated in this way passes through a fiber 815, passes through a collimator 816 to be condensed, and is received by the light detection unit 803.

The information on the intensity of the coherent light received by the light detection unit 803 is converted into electrical information such as a voltage, and is sent to the information acquisition unit 804.

The information acquisition unit 804 processes the data on the intensity of the coherent light, specifically, performs a Fourier transform, to acquire information on the tomographic image. The data on the intensity of the coherent light on which a Fourier transform is performed is data sampled at equal wavenumber intervals in general, but the present invention is not limited thereto, and the data may be data sampled at equal wavelength intervals.

The information on the tomographic image acquired in this way is sent from the information acquisition unit 804 to an image display unit 817 and can be displayed as an image.

Note that, by scanning with the mirror 810 in a direction perpendicular to an incident direction of the radiation light, a three-dimensional tomographic image of the object 812 to be measured can also be acquired.

Further, although not illustrated, intensity of light emitted from the light source unit 801 may be successively monitored and data thereof may be used for correcting an amplitude of a signal for indicating the intensity of the coherent light.

The information acquisition unit 804 can control the light source unit 801 via an electric circuit 818. As described above, in this embodiment, when the wavelength tunable laser device is caused to oscillate at a relatively long wavelength, a voltage is applied to the quantum well structure layer 105. On the other hand, when the wavelength tunable laser device is caused to oscillate at a relatively short wavelength, no voltage is applied to the quantum well structure layer 105. The application of a voltage to the quantum well structure layer 105 can be controlled by, for example, the information acquisition unit 804. That is, the information acquisition unit 804 can function as a control unit configured to control the application of a voltage to the quantum well structure layer 105. The information acquisition unit (control unit) 804 controls the application of a voltage to the quantum well structure layer 105 by appropriately setting the voltage between the electrode 112 and the electrode 113 via the electric circuit 818. Further, the information acquisition unit (control unit) 804 displaces the movable mechanism 122 by appropriately setting the voltage between the electrode 110 and the electrode 112 via the electric circuit 818, to thereby change the oscillation wavelength of laser light emitted from the wavelength tunable laser device 10. Further, the information acquisition unit (control unit) 804 injects a current into the active layer 103 connected to the electrode 111 via the electric circuit 818.

Note that, as an example, a case is herein described in which the information acquisition unit 804 controls the application of a voltage to the quantum well structure layer 105, but the present invention is not limited thereto. A control unit (not shown) provided separately from the information acquisition unit 804 may be used to control the application of a voltage to the quantum well structure layer 105. Further, the control unit provided separately from the information acquisition unit 804 may be used to control the voltage to be applied to the electrode 112 connected to the movable mechanism 122, to thereby change the oscillation wavelength of the laser light emitted from the wavelength tunable laser device 10. Further, the control unit provided separately from the information acquisition unit 804 may be used to inject a current into the active layer 103. In this case, the control unit provided separately from the information acquisition unit 804 may be provided in the light source unit 801, or may be provided separately from the light source unit 801.

According to this embodiment, the measuring device 8 is useful for, for example, acquiring information on a tomographic image of a living body such as an animal or a human being in the field of ophthalmology, dentistry, dermatology, and the like. Note that, information on a tomographic image of a living body includes not only the tomographic image itself of the living body but also a numerical data necessary for acquiring the tomographic image of the living body. In particular, an object to be measured by the measuring device 8 according to this embodiment is a fundus of a human body, and the measuring device 8 according to this embodiment is suitable for acquiring information on a tomographic image of the fundus.

As described above, the wavelength tunable laser device 10 according to this embodiment has an extremely wide wavelength tunable width. Therefore, by using the wavelength tunable laser device 10 according to this embodiment, the measuring device 8 that can acquire a high-resolution tomographic image can be realized.

Note that, as an example, a case is herein described in which the wavelength tunable laser device 10 according to this embodiment is used as a light source of the measuring device 8, but the present invention is not limited thereto. For example, the wavelength tunable laser device 10 according to this embodiment may be used as a light source for optical communication, or may be used as a light source for optical measurement.

Second Embodiment

Figure 6A:
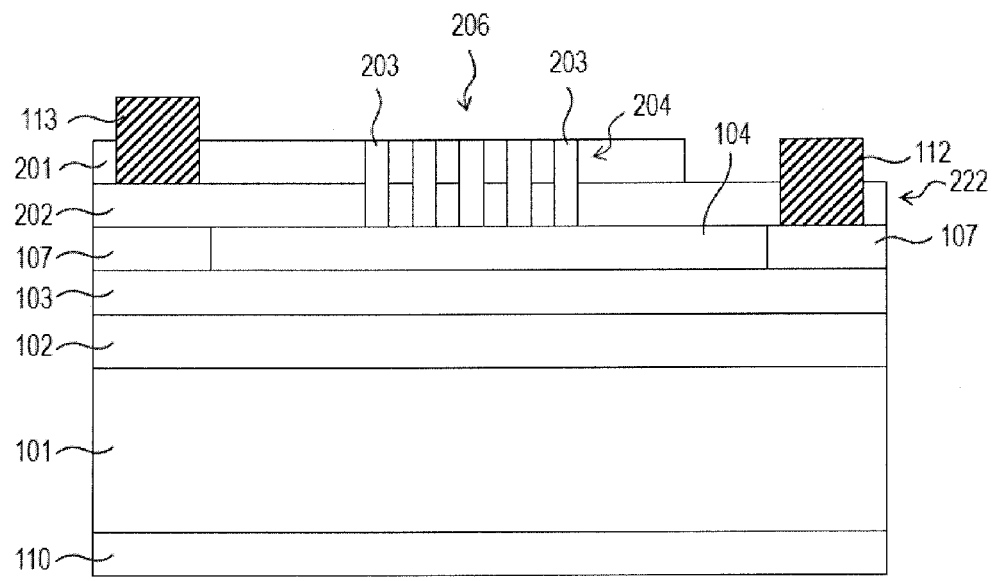
FIG. 6A and FIG. 6B are a sectional view and a plan view, respectively, for illustrating a wavelength tunable laser device according to a second embodiment of the present invention.
Figure 6B:
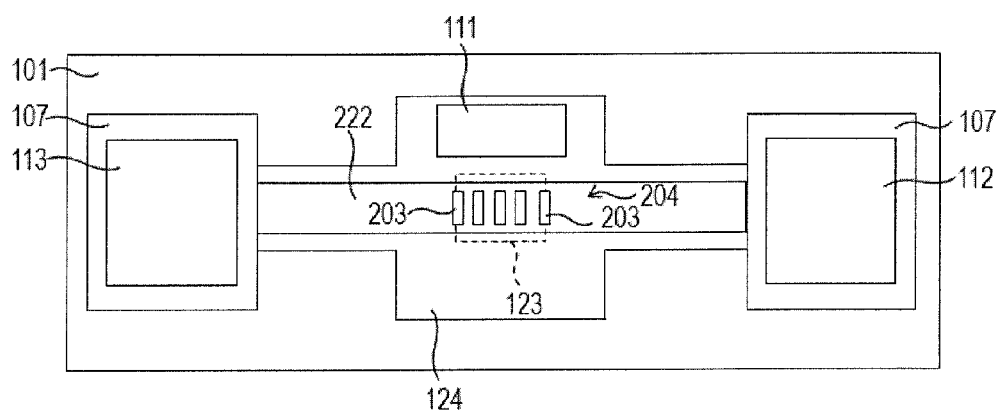

A wavelength tunable laser device according to a second embodiment of the present invention is described with reference to FIG. 6A and FIG. 6B. FIG. 6A is a sectional view for illustrating the wavelength tunable laser device according to this embodiment. FIG. 6B is a plan view for illustrating the wavelength tunable laser device according to this embodiment. The same components as those of the wavelength tunable laser device and the like according to the first embodiment illustrated in FIG. 1A to FIG. 5 are denoted by the same reference numerals to omit or simplify the description.

The wavelength tunable laser device according to this embodiment is configured such that an upper reflector 206 is formed of a high-index contrast subwavelength grating (HCG) 204.

As illustrated in FIG. 6A and FIG. 6B, a quantum well structure layer 202 is formed above the active layer 103. A beam-like support portion (movable mechanism) 222 is formed of the quantum well structure layer 202. Note that, it is conceivable that the movable mechanism 222 is formed by a combination of the quantum well structure layer 202 and an upper reflector layer 201 described later.

The upper reflector layer 201 for forming the upper reflector 206 including the high-index contrast subwavelength grating 204 is formed on the quantum well structure layer 202. A plurality of grating grooves 203 formed in the high-index contrast subwavelength grating 204 that forms the upper reflector 206 are formed not only in the upper reflector layer 201 but also in the quantum well structure layer 202. The grating grooves 203 are formed so as to extend from an upper surface of the upper reflector layer 201 to reach a lower surface of the quantum well structure layer 202.

The grating grooves 203 formed in the high-index contrast subwavelength grating 204 are formed not only in the upper reflector layer 201 but also in the quantum well structure layer 202, but a bias to be applied to the quantum well structure layer 202 is a reverse bias, and hence an adverse effect of a current or the like is not exerted.

The movable mechanism 222 using the high-index contrast subwavelength grating 204 is light-weighted and also thin. Therefore, according to this embodiment, the movable mechanism 222 can be displaced at high speed. Therefore, according to this embodiment, a wavelength tunable laser device that can tune the wavelength at high speed can be provided.

In this manner, the upper reflector 206 may be formed of the high-index contrast subwavelength grating 204. Also in this embodiment, a wavelength tunable laser device having an extremely wide wavelength tunable width can be acquired.

Third Embodiment

Figure 7:
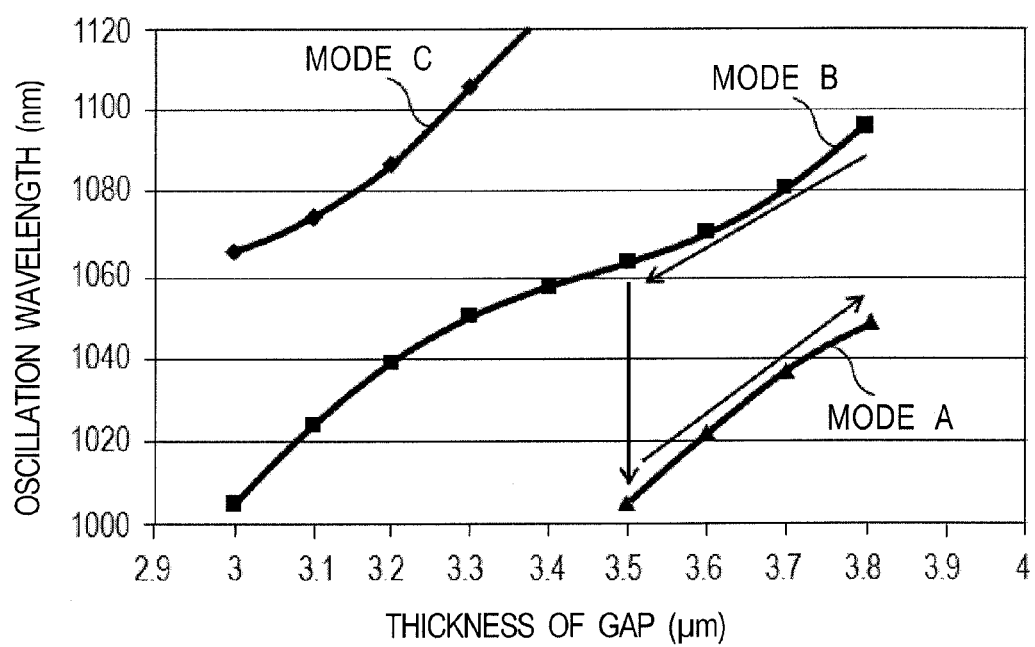
FIG. 7 is a graph for showing a method of driving a wavelength tunable laser device according to a third embodiment of the present invention.

A wavelength tunable laser device according to a third embodiment of the present invention is described with reference to FIG. 7. FIG. 7 is a graph for showing a method of driving the wavelength tunable laser device according to this embodiment. The same components as those of the wavelength tunable laser device and the like according to the first and second embodiments that are illustrated in FIG. 1A to FIG. 6B are denoted by the same reference numerals to omit or simplify the description.

The wavelength tunable laser device according to this embodiment has a structure similar to, for example, that of the wavelength tunable laser device 10 according to the first embodiment.

In this embodiment, the voltage to be applied to the electrode 112 configured to displace the beam-like support portion 122 is gradually increased from 0 V, and a voltage is applied to the quantum well structure layer 105 until the voltage to be applied to the electrode 112 reaches a predetermined voltage. The predetermined voltage is set as, for example, such a voltage as to cause the oscillation wavelength to become a slightly wavelength longer than the center wavelength of a wavelength tunable range. More specifically, the predetermined voltage is set as such a voltage as to cause the oscillation wavelength to become, for example, 1,063 nm. The oscillation is inhibited from being caused at a relatively short wavelength when a voltage is applied to the quantum well structure layer 105, and hence the oscillation is positively caused at a relatively long wavelength. Therefore, for example, when the oscillation is caused at a wavelength longer than 1,063 nm, the oscillation is caused in Mode B. In this manner, the length of the gap 104 can be reduced under the state in which a voltage is applied to the quantum well structure layer 105, that is, under the state in which a reverse bias is applied to the quantum well structure layer 105.

When the voltage to be applied to the electrode 112 configured to displace the beam-like support portion 122 reaches the predetermined voltage, the application of a voltage to the quantum well structure layer 105 is canceled. Then, the oscillation is easily caused in Mode A exhibiting the wavelength side shorter than Mode B, and transition from Mode B to Mode A, that is, the mode hopping occurs. When the mode hopping from Mode B to Mode A occurs, the oscillation wavelength becomes, for example, about 1,005 nm. As described above, the upper reflector 106 is configured such that the threshold gain on the short wavelength side becomes relatively small and that the threshold gain on the high wavelength side becomes relatively large. Therefore, under the state in which no voltage is applied to the quantum well structure layer 105, the oscillation is easily caused on the wavelength side shorter than the center wavelength λc2 of the highly reflective band of the upper reflector 106. Accordingly, under the state in which no voltage is applied to the quantum well structure layer 105, the oscillation is positively caused at a relatively short wavelength.

After the mode hopping occurs, the voltage applied to the electrode 112 configured to displace the beam-like support portion 122 is gradually lowered. When the voltage applied to the electrode 112 is gradually lowered, the oscillation in Mode A is maintained. When the voltage applied to the electrode 112 becomes 0 V, the oscillation wavelength is about 1,048 nm. In this manner, the length of the gap 104 can be increased under the state in which no voltage is applied to the quantum well structure layer 105.

After that, when the application of a voltage to the quantum well structure layer 105 is restarted, the oscillation wavelength becomes, for example, about 1,098 nm. That is, when a voltage is applied to the quantum well structure layer 105, the oscillation wavelength returns to the initial state. The oscillation is inhibited from being caused at a relatively low wavelength when a voltage is applied to the quantum well structure layer 105, and hence the mode hopping from Mode A to Mode B can positively occur.

Such control is conducted, and hence in this embodiment, a voltage to be applied to the quantum well structure layer 105 to reduce the length of the gap 104 is higher than a voltage to be applied to the quantum well structure layer 105 to increase the length of the gap 104.

As described above, according to this embodiment, the mode hopping is caused on purpose. The wavelength tunable width acquired by reciprocation of the beam-like support portion 122 according to this embodiment is almost equal to the wavelength tunable width acquired in the first embodiment. Therefore, the wavelength tunable laser device may be operated as in this embodiment. According to this embodiment, after the mode hopping occurs, the voltage applied to the electrode 112 configured to displace the beam-like support portion 122 is gradually lowered, and thus, an amount of displacement of the beam-like support portion 122 is about a half of that in the case of the first embodiment. According to this embodiment, the voltage applied to the beam-like support portion 122 may be low, and thus, low power consumption and the like can be achieved.

In the above-mentioned sweep, the voltage to be applied to the quantum well structure layer 105 to reduce the length of the gap 104 is set higher than the voltage to be applied to the quantum well structure layer 105 to increase the length of the gap 104. However, a relationship between the increase and reduction of the length of the gap 104 and the voltage to be applied to the quantum well structure layer 105 is not limited to a combination described above, and the same wavelength range can be swept with a reversed combination. Specifically, the wavelength sweep can be conducted by setting the voltage to be applied to the quantum well structure layer 105 to reduce the length of the gap 104 lower than the voltage to be applied to the quantum well structure layer 105 to increase the length of the gap 104. In this case, the drive is conducted in a direction reverse to the arrow shown in FIG. 7. First, the length of the gap 104 is reduced under a state in which the voltage applied to the quantum well structure layer 105 is relatively low, that is, under a state in which the oscillation is caused in Mode A shown in FIG. 7. Therefore, the oscillation wavelength is swept from about 1,048 nm to about 1,005 nm. After that, the voltage to be applied to the quantum well structure layer 105 is increased to cause the mode hopping and change an oscillation mode to Mode B. Therefore, the oscillation wavelength becomes about 1,063 nm. After that, the length of the gap 104 is increased under a state in which the voltage to be applied to the quantum well structure layer 105 is maintained, that is, under a state in which the oscillation is caused in Mode B, to thereby be able to increase the oscillation wavelength and sweep the oscillation wavelength up to about 1,098 nm.

Fourth Embodiment

Figure 8A:
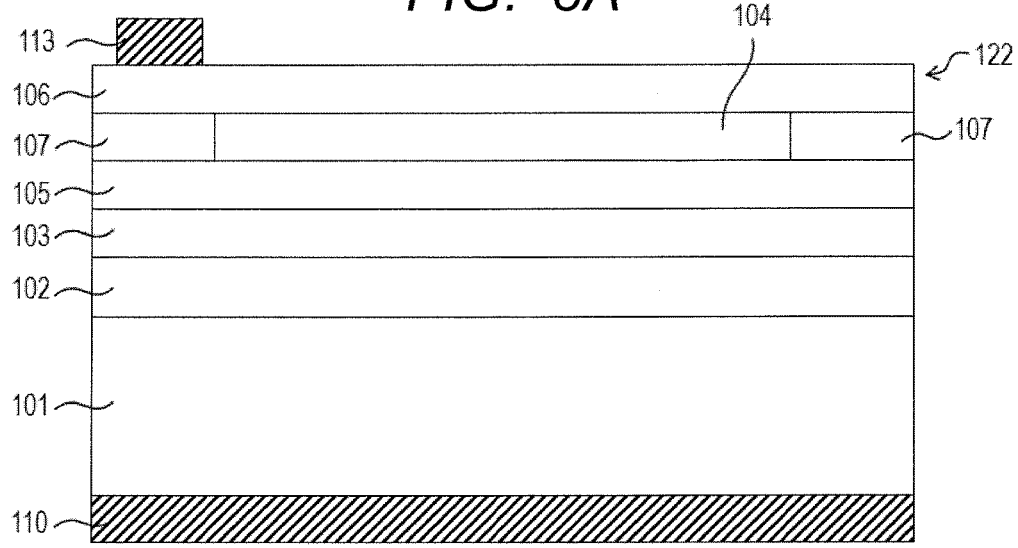
FIG. 8A and FIG. 8B are sectional views for illustrating a wavelength tunable laser device according to a fourth embodiment of the present invention.
Figure 8B:
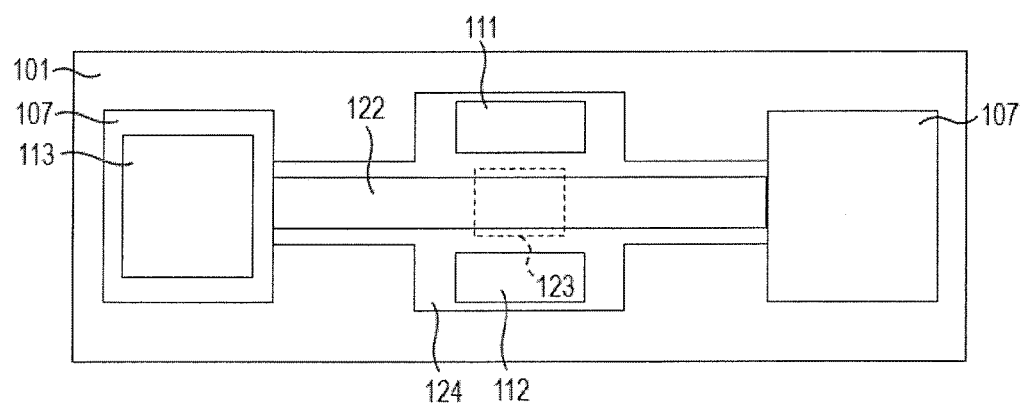

A wavelength tunable laser device according to a fourth embodiment of the present invention is described with reference to FIG. 8A and FIG. 8B. FIG. 8A is a sectional view for illustrating the wavelength tunable laser device according to this embodiment. FIG. 8B is a plan view for illustrating the wavelength tunable laser device according to this embodiment. The same components as those of the wavelength tunable laser device and the like according to the first to third embodiments that are illustrated in FIG. 1A to FIG. 7 are denoted by the same reference numerals to omit or simplify the description.

The wavelength tunable laser device according to this embodiment is configured such that the quantum well structure layer 105 is formed on the active layer 103.

As illustrated in FIG. 8A and FIG. 8B, the quantum well structure layer 105 is formed on the active layer 103. The quantum well structure layer 105 is formed directly on the active layer 103.

The support portions 107 are formed on the quantum well structure layer 105 so as to be spaced apart from each other.

The upper reflector 106 is located above the quantum well structure layer 105. Both ends of the upper reflector 106 are fixed by the support portions 107. In this embodiment, the movable mechanism 122 is formed of the upper reflector 106.

The electrode 113 is electrically connected to an upper surface of the movable mechanism 122. The electrode 112 is electrically connected to the upper surface of the quantum well structure layer 105. The electrode 111 is electrically connected to the upper surface of the active layer 103, that is, the lower surface of the quantum well structure layer 105. The movable mechanism 122 is displaced by changing the voltage to be applied between the electrode 113 and the electrode 112. The quantum confined stark effect of the quantum well structure layer 105 is controlled by applying a voltage between the electrode 112 and the electrode 111. A current is injected into the active layer 103 by applying a voltage between the electrode 111 and the electrode 110.

A method of driving the wavelength tunable laser device according to this embodiment is the same as an operation method for the wavelength tunable laser device according to the first embodiment or the third embodiment, and hence a description thereof is omitted.

In this manner, the quantum well structure layer 105 may be located below the gap 104. Also in this embodiment, the wavelength tunable laser device having an extremely wide wavelength tunable width can be acquired.

Modified Embodiments

The present invention is not limited to the embodiments described above, and various modifications thereof are possible.

For example, the third embodiment is described by taking an exemplary case of causing the mode hopping on purpose in the wavelength tunable laser device according to the first embodiment, but the mode hopping may also be caused on purpose in the wavelength tunable laser device according to the second embodiment or the fourth embodiment. The wavelength tunable laser device according to the second embodiment or the fourth embodiment is also provided with the quantum well structure layer 105 that exhibits the quantum confined stark effect. Therefore, the wavelength tunable laser device according to the second embodiment or the fourth embodiment can also be operated in the same manner as in the third embodiment.

Further, the above-mentioned embodiments are described by taking an exemplary case where the active layer 103 has the quantum well structure, but the structure of the active layer 103 is not limited to the quantum well structure. For example, the active layer 103 may be an active layer having another structure such as a bulk or a quantum dot.

Further, the first, third, and fourth embodiments are described by taking an exemplary case of using DBRs as the reflectors 102 and 106, but the present invention is not limited thereto. For example, high-index contrast subwavelength gratings or the like may be used as the reflectors 102 and 106.

Further, the second embodiment is described by taking an exemplary case of using a high-index contrast subwavelength grating for the upper reflector 106, but the high-index contrast subwavelength grating may be used for the lower reflector 102.

Further, the above-mentioned embodiments are described by taking an exemplary case of sweeping an oscillation wavelength with the center wavelength $\lambda c1$ of the highly reflective band of the reflector 102 and the center wavelength $\lambda c2$ of the highly reflective band of the second reflector 106 or 206 being the center of the sweep, but the present invention is not limited thereto. For example, the center wavelength of the band in which the oscillation wavelength is changed may be different from the center wavelength $\lambda c1$ of the highly reflective band of the reflector 102, and the center wavelength $\lambda c2$ of the highly reflective band of the second reflector 106 or 206.

Further, the above-mentioned embodiments are described by taking an exemplary case where the center wavelength $\lambda c1$ of the highly reflective band of the first reflector 102 and the center wavelength $\lambda c2$ of the highly reflective band of the second reflector 106 or 206 are the same, but the present invention is not limited thereto. For example, the center wavelength $\lambda c1$ of the highly reflective band of the first reflector 102 and the center wavelength $\lambda c2$ of the highly reflective band of the second reflector 106 or 206 may be different from each other.

Further, the above-mentioned embodiments are described by taking an exemplary case where the quantum well structure layer 105 is located above the active layer 103, but the present invention is not limited thereto. The quantum well structure layer 105 may be located below the active layer 103.

Further, the above-mentioned embodiments are described by taking an exemplary case where the electrode 112 combines the electrode configured to apply a voltage to the movable mechanism 122 and the electrode configured to apply a voltage to the quantum well structure layer 105, but the present invention is not limited thereto. The electrode configured to apply a voltage to the movable mechanism 122 and the electrode configured to apply a voltage to the quantum well structure layer 105 may be provided separately from each other.

Further, the first embodiment is described by taking an exemplary case where the quantum well structure layer 105 forms the movable mechanism 122, but the beam-like support portion (movable mechanism) 122 may be provided separately from the quantum well structure layer 105.

Further, the second embodiment is described by taking an exemplary case where the quantum well structure layer 202 forms the movable mechanism 122, but the beam-like support portion (movable mechanism) 122 may be provided separately from the quantum well structure layer 202.

Further, the fourth embodiment is described by taking an exemplary case where the upper reflector 106 forms the movable mechanism 122, but the beam-like support portion (movable mechanism) 122 may be provided separately from the upper reflector 106.

Further, the above-mentioned embodiments are described by taking an exemplary case where both the ends of the beam-like support portion (movable mechanism) 122 are fixed, that is, a case where the movable mechanism 122 is a both-ends fixed beam, but the present invention is not limited thereto. For example, the movable mechanism 122 may be a cantilever having one end being fixed.

Further, the above-mentioned embodiments are described by taking an exemplary case where the interval between the lower reflector 102 and the upper reflector 106 or 206 is changed by the movable mechanism 122 formed of the beam-like support portion, but the present invention is not limited thereto. Various mechanisms (movable mechanism, support mechanism) that can change the interval between the lower reflector 102 and the upper reflector 106 or 206 can be used as appropriate.

Further, the above-mentioned embodiments are described by taking an exemplary case of the wavelength tunable laser device with the center wavelength of the wavelength tunable range being 1,057 nm, that is, the wavelength tunable laser device with a 1,060-nm band, but the present invention is not limited thereto. For example, the present invention may be applied to the wavelength tunable laser device with an 850-nm band. Wavelength tunable laser devices ranging over various wavelengths may be obtained by appropriately setting composition and film thicknesses of the respective components.

Further, in the above-mentioned embodiments, the threshold gain on the short wavelength side is set relatively small by forming the intermediate refractive index layer 303, but a method of setting the threshold gain on the short wavelength side relatively small is not limited thereto. For example, the threshold gain on the short wavelength side may be set relatively small also by setting the optical film thickness of at least one layer within the reflector 106 to about ½ of a center wavelength λc of a reflector.

Further, the above-mentioned embodiments are described by taking an exemplary case where the high-index contrast subwavelength grating 204 is provided in the upper reflector 206, but the high-index contrast subwavelength grating may be provided in the lower reflector 102.

Further, in the above-mentioned embodiments, an intermediate refractive index layer is formed in the upper reflector 106, but the present invention is not limited thereto, and an intermediate refractive index layer may be formed in, for example, the lower reflector 102. In this case, for example, an intermediate refractive index layer having an intermediate refractive index between GaAs and AlAs may be formed below an AlAs layer at the bottom of an alternately laminated film formed of GaAs layers and AlAs layers.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-021296, filed Feb. 5, 2015, and Japanese Patent Application No. 2016-005106, filed Jan. 14, 2016, which are hereby incorporated by reference wherein in their entirety.

What is claimed is:

1. A wavelength tunable laser device, comprising:
a first reflector;
a second reflector;
an active layer formed between the first reflector and the second reflector;
a quantum well structure layer that exhibits a quantum confined stark effect by a reverse bias voltage; and
an electrode configured to apply the reverse bias voltage to the quantum well structure layer,
wherein the active layer and the second reflector have a gap formed therebetween,
the gap having a length to be changed to thereby sweep a resonance wavelength, and
wherein the electrode is further configured to change application of the reverse bias voltage to be applied to the quantum well structure layer depending on the length of the gap when the resonance wavelength is swept.

2. The wavelength tunable laser device according to claim 1, wherein a voltage to be applied to the quantum well structure layer when the length of the gap has a value equal to or larger than a predetermined value is higher than a voltage to be applied to the quantum well structure layer when the length of the gap has a value smaller than the predetermined value.

3. The wavelength tunable laser device according to claim 1, wherein a voltage to be applied to the quantum well structure layer to reduce the length of the gap is higher than a voltage to be applied to the quantum well structure layer to increase the length of the gap.

4. The wavelength tunable laser device according to claim 1, wherein at least one of the first reflector and the second reflector comprises a distributed Bragg reflector obtained by alternately laminating a first layer and a second layer having a higher refractive index than the first layer.

5. The wavelength tunable laser device according to claim 1, wherein at least one of the first reflector and the second reflector comprises a high-index contrast subwavelength grating.

6. The wavelength tunable laser device according to claim 1, wherein the length of the gap is longer than 1.7 µm under a state in which an interval between the first reflector and the second reflector is not changed.

7. The wavelength tunable laser device according to claim 1, wherein the quantum well structure layer has a multiple quantum well structure.

8. The wavelength tunable laser device according to claim 1, further comprising a pair of electrodes configured to apply a voltage to the quantum well structure layer,
wherein the quantum well structure layer comprises a p-type semiconductor layer and an n-type semiconductor layer, and
wherein one of the pair of electrodes is electrically connected to the p-type semiconductor layer, and another one of the pair of electrodes is electrically connected to the n-type semiconductor layer.

9. The wavelength tunable laser device according to claim 1,
wherein the second reflector is caused to vibrate by applying an alternating voltage to a support portion configured to support the second reflector, and
wherein the electrode is further configured to change the application of the reverse bias voltage to be applied to the quantum well structure layer so as to correspond to an amplitude change in the alternating voltage.

10. The wavelength tunable laser device according to claim 1, wherein a gain of the active layer at a wavelength shorter than a predetermined wavelength is larger than a gain of the active layer at a wavelength longer than the predetermined wavelength.

11. The wavelength tunable laser device according to claim 1, wherein an absorption edge of the quantum well structure layer falls on a wavelength side shorter than a shortest wavelength within a sweep range of the resonance wavelength when the electrode does not apply a reverse bias voltage to the quantum well structure layer.

12. The wavelength tunable laser device according to claim 1, wherein the electrode is further configured to apply a reverse bias voltage to the quantum well structure layer when an oscillation is caused at a wavelength longer than a predetermined wavelength.

13. An optical coherence tomography apparatus, comprising:
a wavelength tunable laser device including:
a first reflector;
a second reflector;
an active layer formed between the first reflector and the second reflector;
a quantum well structure layer that exhibits a quantum confined stark effect by a reverse bias voltage; and
an electrode configured to apply the reverse bias voltage to the quantum well structure layer,
wherein the active layer and the second reflector have a gap formed therebetween,
the gap having a length to be changed to thereby sweep a resonance wavelength, and
wherein the electrode is further configured to change application of the reverse bias voltage to be applied to the quantum well structure layer so that a gain of a laser at the resonance wavelength becomes larger than a gain of the laser at a wavelength in another mode capable of causing an oscillation when the resonance wavelength is swept,
the optical coherence tomography apparatus further comprising:
an interference optical system configured to cause light from the wavelength tunable laser device to branch off into irradiation light to be radiated to an object to be measured and reference light, and to generate coherent light with reflection light of the irradiation light radiated to the object to be measured and the reference light;
a light detection unit configured to receive the coherent light; and
an information acquisition unit configured to acquire information on the object to be measured based on a signal received from the light detection unit.

* * * * *